Aug. 3, 1965 H. J. LAURENT 3,199,029
AUTOMATIC GAIN CONTROL SYSTEM
Filed May 3, 1961
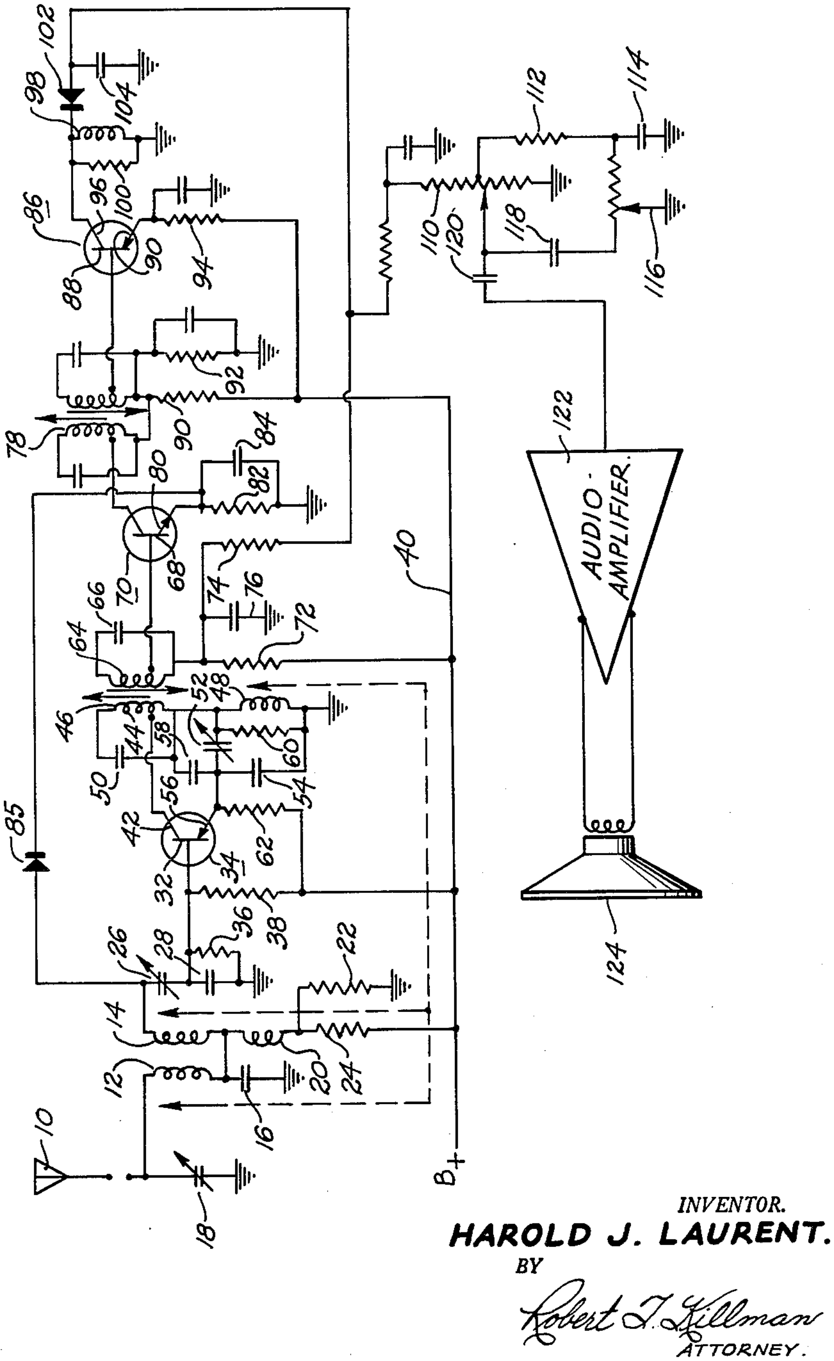
INVENTOR.
HAROLD J. LAURENT.
BY
Robert T. Killman
ATTORNEY.

United States Patent Office 3,199,029
Patented Aug. 3, 1965

3,199,029

AUTOMATIC GAIN CONTROL SYSTEM

Harold J. Laurent, Baltimore, Md., assignor to The Bendix Corporation, Towson, Md., a corporation of Delaware Filed May 3, 1961, Ser. No. 107,358
1 Claim. (Cl. 325—319)

This invention relates to radio receivers and more particularly to a novel and effective automatic gain control system for a radio receiver.

Fully transistorized radio receivers have become increasingly attractive, particularly for mobile and portable equipment because of their low power drain and their resistance to damage from physical shock and vibration. Most of such receivers have had a tuned radio frequency stage of amplification in order to provide the desired amount of gain to the succeeding converter stage and an automatic gain control has typically been connected to this stage. The transistors required for operation in the radio frequency stage must operate over a wide frequency range and are considerably more expensive than those used in the succeeding intermediate frequency stages. Where extreme sensitivity is not required it has been found possible to eliminate the tuned radio frequency amplification stage and a considerable cost advantage results even if an additional stage of intermediate frequency amplification is required. With no tuned radio frequency stage, however, problems are presented in providing a satisfactory automatic gain control in applications such as automotive radios when signal input voltage may vary from a few microvolts to 2 volts. It is not considered satisfactory to connect an automatic gain control potential to a transistor converter stage because the effectiveness of the oscillator action is impaired and because signal level changes will normally cause a frequency shift which is undesirable. To rely on automatic gain control around an intermediate frequency stage only will result in an insufficient range of control, at least for many applications. In some circuits the converter stage has been separated into separate transistor stages for each of the oscillator and the mixer, and the automatic gain control potential is connected to the mixer. Again, this does not provide the kind of control needed for automobile radios because the magnitude or range of such control available is limited by the mixer. The automatic gain control potential obviously cannot be supplied to the mixer in such magnitude as to impair the operation of the mixer. It is, therefore, an object of the present invention to provide a system of automatic gain control in a transistorized radio receiver suitable for mobile use wherein no radio frequency amplifier is employed.

It is another object of the present invention to provide a design for a fully transistorized radio suitable for automobile use wherein satisfactory performance can be provided at lowest cost.

It is another object of the present invention to provide a minimum cost radio receiver using all transistors which is suitable for automobile use and which has extremely effective automatic gain control action.

Other objects and advantages will become apparent from the following specification taken in combination with the accompanying drawing in which the single figure is a schematic diagram of a radio receiver incorporating the principles of my invention.

Referring to the drawing, an antenna is shown at numeral 10 which is connected to a double-tuned antenna circuit including a primary tuning coil 12 and a secondary tuning coil 14. The coils 12 and 14 are connected to ground through a coupling capacitor 16. A trim on the input circuit is provided by means of a variable capacitor 18. Coils 12 and 14 are connected to a bias network comprising resistors 22 and 24 through a choke coil 20 of relatively high inductance as compared to the tuning coils. Connected across coils 14 is a pair of capacitors 26 and 28, capacitor 26 being variable to act as a trim device for tuning the secondary circuit and the two capacitors acting as a tap to provide an impedance match between the antenna circuit and the base circuit 32 of the following transistor 34. The base 32 of PNP transistor 34 has its bias established by means of resistors 36 and 38 which are connected between the power supply line 40 and ground. The collector 42 of transistor 34 is connected to a tap on the primary winding 44 of an intermediate frequency transformer 46. One end of the primary winding 44 is connected to an oscillator coil 48, the permeability tuning member of which is mechanically coupled to the corresponding elements of coils 12 and 14. A capacitor 50 is connected across the coil 44 to complete the resonant circuit on the primary side of the transformer 46. A pair of capacitors 52 and 54, which form part of the oscillator circuit also provide a means for securing the desired impedance relationship between the oscillator coil 48 and the emitter 56 of transistor 34. A capacitor 58 shown in the oscillator circuit has negative temperature characteristics to compensate for the temperature effects occurring elsewhere in the oscillator. A resistor 60 connected across the oscillator coil 48 limits the Q of this coil to control the variation in voltage output of the oscillator with changes in frequency. The resistor 62 connected between the emitter 56 and the power line 40, provides the remainder of the coupling network to the emitter.

The secondary side of transformer 46 includes a winding 64 and a capacitor 66 connected thereacross to provide a resonant circuit operating it the conventional manner. The base 68 of the first intermediate frequency transistor amplifier 70 is connected to a tap on winding 64 and is biased at the desired voltage level by means of resistors 72 and 74. A by-pass capacitor 76 provides a path to ground for signal components of both intermediate and audio frequency. The transistor 70 operates as a conventional grounded emitter amplifier stage, providing an amplified signal to the second intermediate frequency interstage transformer 78 which also operates in a conventional manner. The emitter 80 of transistor 70 is connected to ground through a resistor 82 having a capacitor 84 connected thereacross. Connected between the emitter 80 and one end of the antenna secondary coil 14 is a diode 85 which provides the automatic gain control for the system.

The second intermediate frequency amplifier stage includes a transistor 86 having a base 88 connected to a tap on the secondary winding of transformer 78. The bias for the base 88 is established by means of resistors 90 and 92 connected between the power line 40 and ground. The emitter 90 of this PNP transistor is connected to the power line 40 through a resistor 94. The load impedance for the collector 96 of transistor 86 consists of a coil 98 connected between the collector circuit and ground with a resistor 100 connected in parallel therewith. A diode 102 serves as a detector for the receiver and a capacitor 104 provides a means for bypassing an undesired intermediate frequency component.

As a result of the operation of the detector diode 102 a low level audio frequency signal appears across a potentiometer 110 which serves as a volume control for the receiver. Connected to a tap on the potentiometer 110 and its slider are a resistor 112, a capacitor 114, a potentiometer 116, and a capacitor 118 which circuit provides a tone control for the system. A capacitor 120 serves as an audio coupling capacitor. The signal thus selected on the slider of potentiometer 110 is supplied to an audio amplifier 122 which may be of any desired configuration and when the signal is amplified it is connected to a speaker 124.

Operation of the receiver is, in general, conventional except for the automatic volume control operation. The diode 85 is typically a silicon diode having a rather substantial threshold voltage in the forward direction. This threshold voltage and the values of the associated components are chosen such that when the input signal is small, there is no flow across diode 85 and therefore no automatic gain control action. The diode is effectively back biased by the voltage across the emitter resistor 82 and the secondary antenna circuit is unaffected by the presence of the diode. Both primary and secondary antenna circuit Q's are high and these circuits are coupled to near critical coupling. The radio then has maximum gain. As the input signal is increased the voltage downstream of the detector diode 102 increases in the negative direction and this causes the effective bias on the base 68 of transistor 70 to become less positive. Consequently the voltage at emitter 80 becomes less positive and this, of course, is the voltage on one side of diode 85. The voltage level on the opposite side of diode 85 is established by means of the circuit values of the voltage divider consisting of resistors 22 and 24 which are effectively connected to the B+ line 40 and ground. The initial effect of the change in bias across diode 85 is to increase its capacitance and thus detune the secondary of the antenna input circuit, which would have been initially trimmed on a very small signal. At some value of signal level the voltage drop across diode 85 changes from an essentially negative bias to a positive bias of such value as to cause diode 85 to conduct. The reduced dynamic impedance of diode 85 then loads the secondary antenna circuit while the changing capacitance of the diode continues to detune the secondary circuit. These two combined effects cause a rapid decrease in transmission through the antenna circuit. At the same time the reduced collector current of transistor 70 causes its gain to drop and the composite effects of these two automatic gain control actions produces an extremely flat output as the input rises beyond the level at which diode conduction begins, preceded by a range of lower signal levels in which control is adequate to offset normal signal fluctuations encountered in driving a car. The antenna gain is reduced such that it is virtually impossible to overload any stage of the receiver, contrary to the usual experience with receivers using a low-voltage power supply for the amplifiers.

While only one embodiment has been shown and described herein modifications may be made without departing from the scope of the invention. The coil 20 in the antenna diode circuit provides a high impedance to signal frequencies, while maintaining a low D.C. resistance to prevent limiting of the diode current. It may be eliminated in favor of a higher resistance bias network if less automatic gain control range is considered adequate. The system could also be used in a radio with a single intermediate frequency amplification stage if the amplifier performance is otherwise satisfactory. The system is shown with transistor amplifiers, but is equally valuable where the amplifiers are vacuum tubes having only a low-voltage power supply, such as the hybrid receivers which have become common in recent years. Other modifications will occur to those skilled in the art.

I claim:

An automatic gain control for a superheterodyne radio receiver, comprising a double tuned antenna circuit including a first tuned circuit and a second tuned circuit approximately critically coupled to said first, a converter stage receiving signal from said second tuned circuit and providing an intermediate frequency output, an intermediate frequency amplifier including a transistor connected in common emitter circuit configuration with a feedback resistor bypassed for intermediate frequencies in said emitter circuit and means for biasing the base-emitter junction of said transistor, means for detecting the intermediate frequency output of said amplifier and for providing a direct potential proportional to the amplitude of the output of said intermediate frequency amplifier, means applying said direct potential to the bias means of said intermediate frequency amplifier in a manner tending to reduce the bias and hence the gain of said amplifier, a diode connected between said second tuned circuit and the emitter resistor of said amplifier, and means for biasing said diode for non-conduction at the potential said amplifier emitter assumes for small signals, said diode bias changing in a manner tending to increase conduction by the change in emitter potential reflecting a reduction in amplifier bias by said detector potential.

References Cited by the Examiner

UNITED STATES PATENTS

| | | | |
|---|---|---|---|
| 2,947,859 | 8/60 | Macdonald | 325—411 |
| 2,981,835 | 4/61 | Webster et al. | 250—20 |
| 3,007,046 | 10/61 | Schultz | 250—20 |
| 3,072,849 | 1/63 | Firestone | 325—411 |

FOREIGN PATENTS

| | | |
|---|---|---|
| 846,131 | 8/60 | Great Britain. |

DAVID G. REDINBAUGH, *Primary Examiner.*

ROY LAKE, *Examiner.*